United States Patent [19]
Leveen

[11] Patent Number: 5,795,356
[45] Date of Patent: Aug. 18, 1998

[54] MICROELECTRONIC COMPONENT FABRICATION FACILITY, AND PROCESS FOR MAKING AND USING THE FACILITY

[75] Inventor: Lindsay Leveen, Tiburon, Calif.

[73] Assignee: SLSP Partners, Inc., Rancho Santa Fe, Calif.

[21] Appl. No.: 655,958

[22] Filed: May 31, 1996

[51] Int. Cl.[6] .............................. H01L 21/50; B01L 1/04
[52] U.S. Cl. ......................... 29/25.01; 438/800; 438/908
[58] Field of Search ........................ 29/250.01; 414/217, 414/221; 118/719, 729; 438/800, 908; 454/187

[56] References Cited

U.S. PATENT DOCUMENTS

| | | | |
|---|---|---|---|
| 4,592,306 | 6/1986 | Gallego | 117/719 |
| 4,917,556 | 4/1990 | Stark et al. | 414/217 |
| 4,923,584 | 5/1990 | Bramhall, Jr. et al. | 204/298.25 |
| 4,951,601 | 8/1990 | Maydan et al. | 118/719 |
| 4,985,722 | 1/1991 | Ushijima | 352/319 |
| 5,067,218 | 11/1991 | Williams | 29/25.01 |
| 5,076,205 | 12/1991 | Vowles et al. | 118/719 |
| 5,135,608 | 8/1992 | Okutani | 156/643 |
| 5,186,718 | 2/1993 | Tepman et al. | 29/25.01 |
| 5,310,410 | 5/1994 | Begin et al. | 29/25.01 |
| 5,344,365 | 9/1994 | Scott et al. | 454/187 |
| 5,380,682 | 1/1995 | Edwards et al. | 437/225 |
| 5,611,655 | 3/1997 | Fukasawa et al. | 414/217 |

OTHER PUBLICATIONS

Bader, Martin E., "Integrated Processing Equipment," Solid State Technology, pp. 149–154, May, 1990.
Circular Centered Single-Column Fab, Documentation III, 2001 Fab System,, Special Issue on 2001 Semiconductor Manufacturing, 5 pages, May 23, 1996, pp. 20–23.

Primary Examiner—David Graybill
Attorney, Agent, or Firm—Fliesler, Dubb, Meyer & Lovejoy

[57] ABSTRACT

A process for manufacturing microelectronic components that can be fabricated in a facility 1 including integrated circuits on silicon wafers, flat panel displays on glass substrates or any other microelectronic components fabricated in a similar fashion, a process of constructing the facility, and the facility. The fabrication facility 1 relies on a central hub 3 from which processing areas 2 extend out radially like spokes. The processing areas 2 are arranged in a pattern so as to be served by common services which include gases, chemicals, ultra pure water, vapor exhaust, liquid waste, air conditioning, centralized vacuum, centralized clean compressed air, hot water, steam, natural gas, power including emergency, conditioned, and unconditioned power, and process cooling water.

23 Claims, 2 Drawing Sheets

MICROELECTRONIC COMPONENT FABRICATION FACILITY, AND PROCESS FOR MAKING AND USING THE FACILITY

FIELD OF THE INVENTION

The present invention relates to a microelectronic component fabrication facility.

BACKGROUND OF THE INVENTION

Presently, microelectronic components such as by way of example only, integrated circuits and flat panel displays are fabricated in a rectangular facility which can typically be a 3-story structure with outside dimensions of, for example, about 600 feet by 180 feet. The first or subfab floor generally contains the gas handling piping, the second or fab floor generally holds the clean room and the various processing stations which can accomplish processes such as lithography, etching, sputtering, chemical vapor deposition, diffusion, and the like, while the third floor handles air circulation. Generally the facility is laid out with a longitudinal clean room which can run the length of the structure, up to 600 feet. Various work stations are located substantially perpendicularly to and on each side of the clean room. An automation system is used to carry the disks and substrates which are being processed up and down the clean room, and perpendicularly to the clean room to the equipment of the various processing steps.

Such an arrangement is expensive to build and operate from a number of standpoints. First, the external shell of the facility has to be designed so that the outer walls support the entire roof so that there are no interior posts to interfere with the positioning of the equipment in the fabrication process. Such an arrangement requires that the roof be supported by an expensive and complicated support system.

Other disadvantages of such a facility resides with the actual operation of the facility itself. In such an arrangement, the automation system for moving the wafers from station to station must travel up and down the elongated clean room area and out to the work stations in order to find the next available station for the required process. This can require the automation system to transport the wafers great distances.

Further, it is not convenient to expand such a typical fabrication facility. Generally, it would be simpler just to duplicate the complete fabrication facility in an adjacent area. Any modification to such facilities would require substantial changes, including the movement of walls, process equipment, gas circulation systems and the like. Further to retrofit, replace or upgrade existing equipment in such a facility would require that the facility be shut down and that equipment and structure be moved in order to access equipment that is to be retrofitted or changed.

A futuristic design for a fully automated fabrication facility was proposed in a paper from Tohoku University, entitled *Circular Centered Single-Column Fab*. In this design, a circular dome-shaped building was proposed which was supported by an outer peripheral wall and a central tower. In this facility, the fabrication equipment is located outwardly of the central tower. Such equipment includes photolithography stations and the like. Such a configuration was never constructed and if it had been, it would have been extremely expensive due to the large dome-shaped roof required and the structure necessary to hold that roof in place. Further, safety would be an issue as special safety quarters would have to be constructed in order to allow for exit through the periphery of the structure. A further disadvantage is that the support services for such a plant such as gas plants, ultra pure water plants, chemical plants, and air-conditioning plants are located outside the circular area of the dome housing and thus increase the distance needed for distribution piping and conduit to serve the fabrication facility. Further, an expansion of such a facility would be difficult in that the outer walls, being required to support the roof, cannot be easily removed or modified.

The present invention solves these disadvantages.

SUMMARY OF THE INVENTION

The present invention relates in general to a method and apparatus to improve and optimize the layout of a microelectronic component fabrication facility. The fabrication facility is unique in providing low cost construction and operation, and easy expansion without interrupting ongoing operations. The fabrication facility relies on a central hub from which processing areas extend radially out like spokes. A housing is provided over each spoke. The processing areas are arranged in a pattern so as to be served by common services which include gases, chemicals, ultra pure water, vapor exhaust, liquid waste, air conditioning, centralized vacuum, centralized clean compressed air, hot water, steam, natural gas, power including emergency, conditioned, and unconditioned power, and process cooling water. The layout of the factory maximizes the area of common support services and thereby minimizes the cost of installing these process support services by avoiding duplication, allows for easy and quick installation of the semiconductor fabrication tools (semitools) used to fabricate microelectronic components, and allows for easy expansion of the factory without affecting ongoing operations by extending the processing areas further out radially from the hub. The layout of the fabrication facility simplifies the automation of substrate and wafer transfer and correspondingly improves the utilization rate of semitools.

Accordingly, the layout of the fabrication facility is significantly different from the state-of-the-art fabrication facilities that are now in common use. The present invention provides for a fabrication facility which is less expensive to construct and easier to modify in that it is built about a central hub which houses common services with the individual fabrication processes radiating outwardly from the central hub and enclosed by a housing much as spokes radiate outwardly from a central hub. This configuration allows common support services to be clustered adjacent to the appropriate processes so that plumbing runs can be minimized. Further, the fabrication facility can be expanded without interfering with ongoing operation, without the major cost for reconstructing the building which houses the fabrication facility, by simply extending out along each of the hubs. In prior fabrication facilities, the outer wall is used to support the entire roof so that the work area underneath the roof can be columnless so as not to interfere with the fabrication process. In the futuristic model described hereinabove, the outer walls are load-bearing and would require a major engineering feat in order to allow the facility to be expanded. Further, in the present invention, safety exits can be conveniently provided along the walls of the housing which radiate out from the spoke. Thus, individual corridors need not be constructed. Further, inbetween each of the outer radiating processing areas, access can be created in the peripheral walls in order to allow repair and replacement of processing equipment without interfering with the operation of the entire facility. Large equipment can be easily moved into position to replace and repair processing equipment without interfering with other operations, and without having to remove other equipment in order for the machinery to access the desired processing tool.

Other objects and advantages of the invention can be obtained form a review of the specification, claims and figures.

DETAILED DESCRIPTION OF THE PREFERRED EMBODIMENT

The present invention is based on the inventor's recognition that an improved layout of a microelectronic component fabrication facility can result in lower initial and ongoing costs, provide for easy expansion without interrupting ongoing operations, improve semitool utilization, enhances production capacity, and provide for simpler automation of substrate transfer. An embodiment of the facility of the invention is generally denoted as 1 as illustrated in FIG. 1, and FIG. 2.

The present invention relates in general to a method and apparatus to improve and optimize the layout of a microelectronic component fabrication facility. The layout of the fabrication facility relies on a hub and spoke approach to maximize the use of common support services, which include: gases, chemicals, ultra pure water, vapor exhaust, liquid waste, air conditioning, centralized vacuum, centralized clean compressed air, hot water, steam, natural gas, power including emergency, conditioned, and unconditioned power, and process cooling water, thereby minimizing the duplication of these support services. The layout of the processing areas as spokes provides for simple hookup of semitools to the facilities support services as all tools can be installed in an "add on", "snap on" or a "cookie cutter" approach. In each of the processing spokes a common processing operation in the fabrication of a microelectronics component is performed, e.g. chemical vapor deposition, lithography, sputtering, ion implantation, or etching etc. These processing operations are well established and commonly employed in the present state-of-the-art. This layout also provides for easy uninterrupted expansion of the fabrication facility by extended the processing areas further out radially from the hub without interrupting ongoing operations and without major alteration to the housing for the fabrication facility. Automation of the transfer of substrate, silicon wafers or glass plates as the case may be, is also simplified as the automation stockers need only traverse the radial processing area toward the hub and then traverse along the hub to the next processing area spoke and out the spoke to the next semitool in the processing sequence. As identical processing tools are located side by side down each processing area spoke, the automation system need only search for the first available tool closest to the spoke. This queuing and serving approaches simplifies the automation methodology and leads to improved utilization of available semitools allowing for greater throughput with an equivalent number of semitools.

Figure 1:
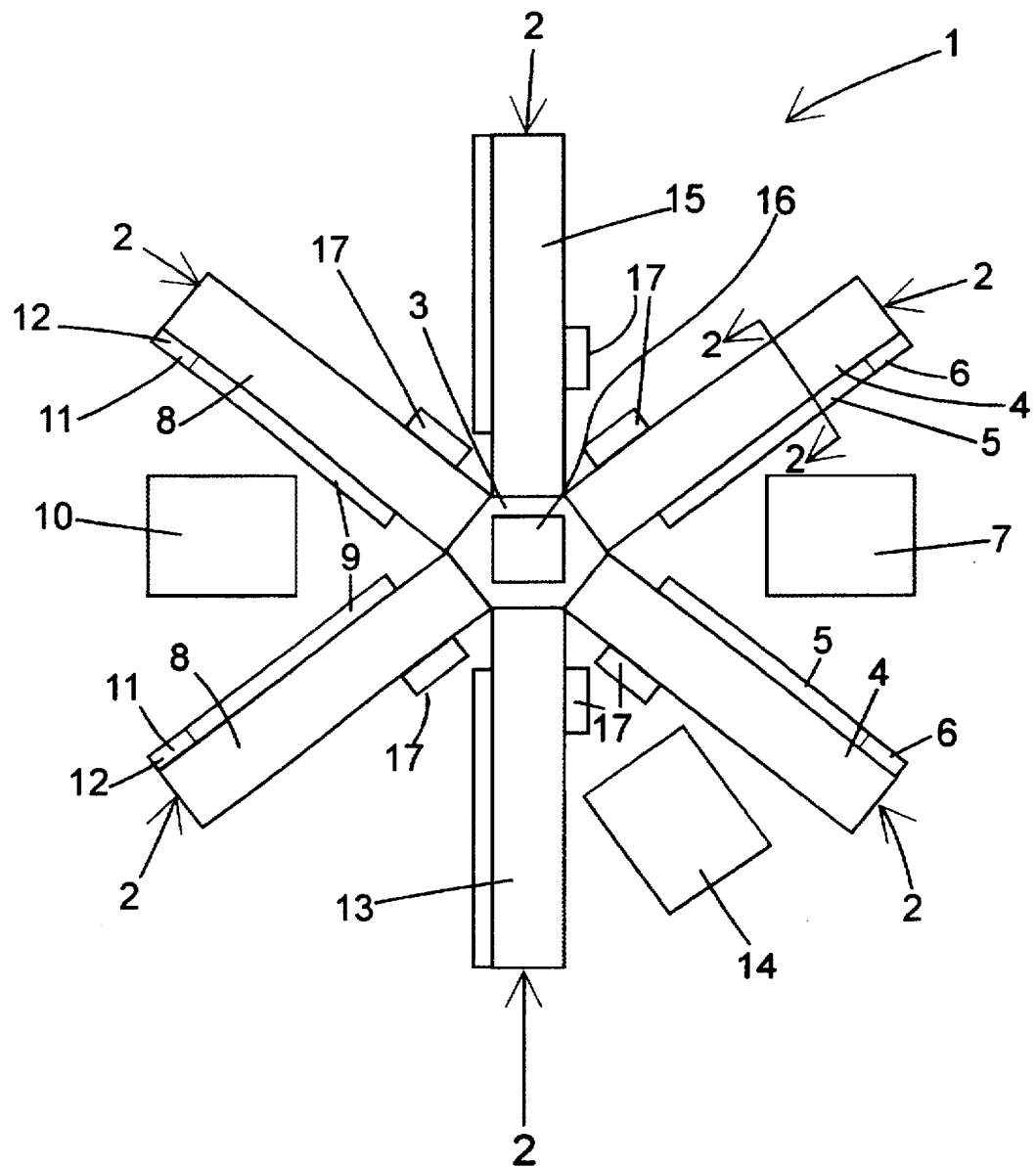
FIG. 1 is a schematic plan view of an embodiment of a microelectronic component fabrication facility of the invention.
Figure 2:
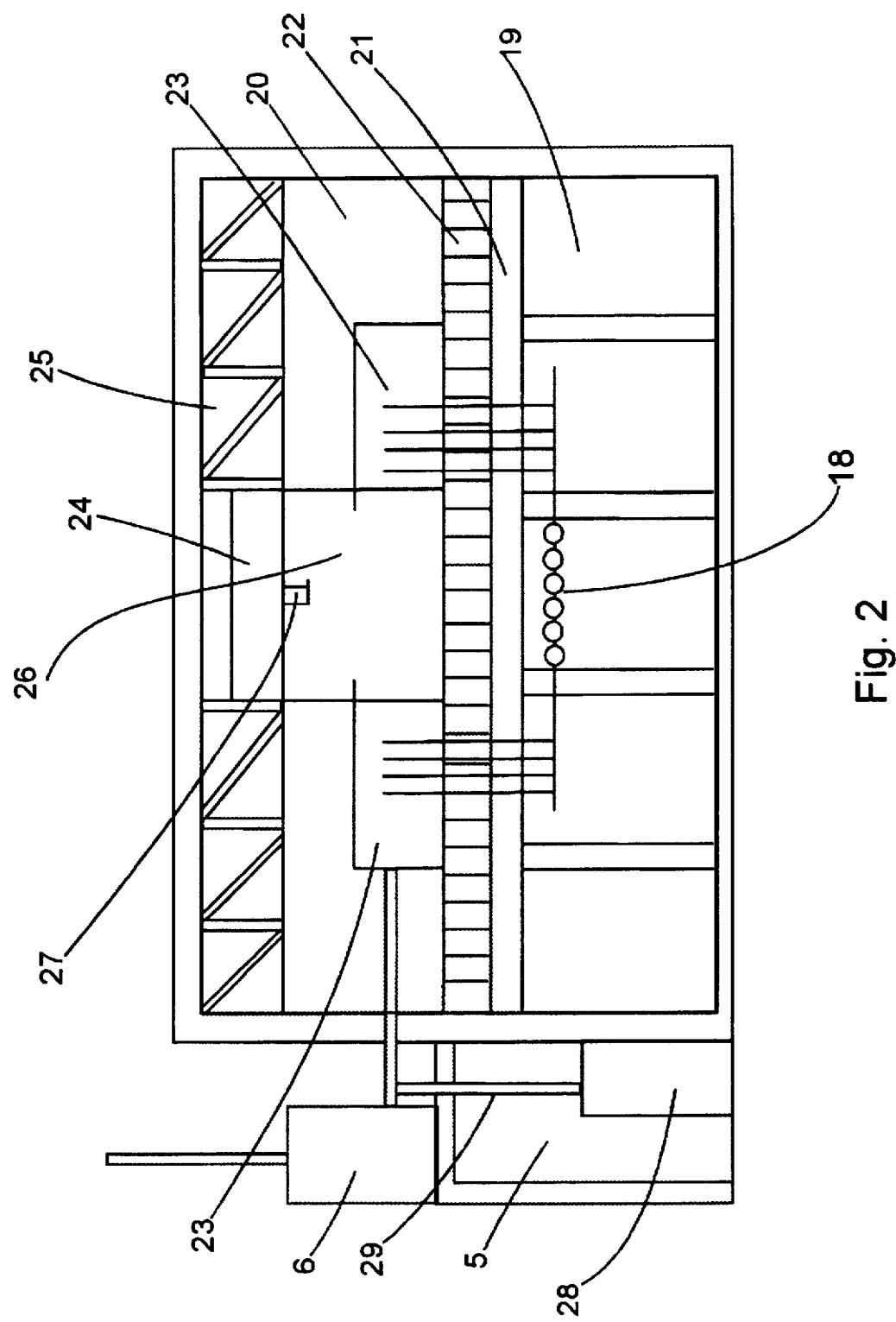
FIG. 2 is a schematic section of one of the processing areas of the embodiment of the microelectronic component fabrication facility of FIG. 1 taken through line 2—2.

Embodiment of FIGS. 1 and 2

In FIG. 1, the processing areas 2 of the microelectronic component fabrication facility radiate out from a central hub 3. A clean room for facility 1 is located in the central hub 3 and along the outwardly radiating spokes or processing areas 2. The central hub 3 can be in the shape of a circle, a triangle, square, rectangle, pentagon, hexagon, heptagon, octagon, or any other uniform or non-uniform closed or open shape. The processing areas 2 are constructed as long slender spokes radiating out from the hub 3. The processing areas 2 each house one particular processing operation employed in the fabrication of microelectronic circuitry. These operations include chemical vapor deposition (CVP), etching, lithography, spattering, ion implantation, and diffusion, among others.

One or more selected processing areas 2 are identified as gas processing area 4. These gas processing areas 4, which rely on gases, are clustered together. Each of these gas processing areas 4 has a gas vault 5 attached along the length of the spoke. The exhaust of the gas processing area 4 and the gas vaults is treated in a scrubber 6. The bulk and specialty gas storage or on-site manufacturing systems 7 are located in a yard outside the building in close proximity to the gas processing areas 4.

One or more selected processing areas 2 are identified as liquid chemical processing areas 8. These liquid chemical processing areas 8 rely on liquid chemicals, and are thus clustered together. Each of these liquid chemical processing areas 8 have a liquid chemical vault 9 attached along the length of the spoke. The liquid waste storage and treatment facilities 10 are located outside in a yard in close proximity to the liquid chemical processing areas 8. Vapor exhausts containing volatile organic compounds (VOCs) are collected in a VOC exhaust system 11 and are treated in a VOC abatement system 12.

One or more selected processing areas 2 are identified as ultra pure water processing areas 13. Ultra pure water processing areas 13 rely on ultra pure water and are segregated from the other processing areas 2. The ultra pure water manufacturing system 14 is located outside in a yard in close proximity to the ultra pure water processing areas 13.

One or more selected processing areas, known as other processing areas 15 that do not require gas, chemicals or ultra pure water service, and are also segregated. Common services such as electricity, process cooling water, chillers, natural gas, central vacuum, compressed and dry air, hot water, and steam are all produced in plant 16 located in the central hub 3. Make up air, that is conditioned, is supplied to each of the processing areas 2 and the hub 3 via dedicated make up air handlers 17. Chilled water or heating water is fed to the makeup air handlers 17 from the chillers or boilers of central plant 16, which is located in the central hub 3.

In FIG. 2 the improved layout of the facility 1 demonstrates that the facility 1 minimizes the size and amount of distribution piping 18 in the subfab floor 19. The distribution piping 18 penetrates into the upper fab floor 20 through the concrete slab 21 and the raised floor 22 and connects to the semitools 23 which perform the various steps in facilitating a semiconductor device. The recirculation air handlers 24 are located in the interstitial space 25 above the clean processing bay 26 and are served by chilled water from the central plant 16 in order to recondition the air. The automation system (automation stockers) 27 which automatically handles and moves the wafers to be processed, from processing station to processing station, is also improved and simplified as all semitools 23 in any one processing area 2 are replicas (i.e., they all perform the same function whether it be etching, CVP, diffusion, or lithography, etc.), and the automation system 27 need only search for the first available semitool 23 on a spoke to perform the next required processing step. Vapor exhausted from the gas cabinets 28 in the gas vault 5 and the semitools 23 are exhausted in a common exhaust header 29 to the scrubber 6. The length and diameter of the common exhaust header 29 are minimized due to the close proximity of the gas cabinets 28 to the semitools 23. Expansion of the fabrication facility 1 can be easily accomplished by extending each processing area radially outwardly from the distal end of each processing area without interfering with the operation of the facility. Conduit can be easily extended to serving the extended processing areas. Further, as described below, through the lateral walls located between the proximal and distal ends of the housing of each processing area, processing equipment can be installed, repaired, and removed easily by the use of heavy equipment brought inbetween adjacent processing areas. Unlike with the prior art, equipment does not have to be moved to have ready access to any desired piece of processing equipment. Also, as described below, unlike the prior art, the spoke housing can have a width of about 60 feet compared to 180 feet of a conventional facility. Thus, the roof support system of the present invention can be simpler and less costly to construct.

Safety Features of the Improved Facility

Under the Uniform Building Code, a microelectronic component fabrication facility is classified as an H6 occupancy. This occupancy classification requires stringent emergency exiting standards including the separation of emergency exit corridors from chemical distribution routes. The H6 occupancy classification requires emergency exits to be closely spaced. All of these requirements place serious restrictions on the layout of microelectronic component fabrication facilities. The current state-of-the-art facility which the typical clean bay and service chase or ballroom laid out in a large rectangular building will have as much as 10% of the building's space used up by an emergency corridor system. The improved hub and spoke layout of this invention overcomes this deficiency as emergency exits and stairways are located as mandated under the building code along the length of the spoke, without requiring a special emergency corridor system. The emergency stairways are designed to be accessible from any level of the processing area.

Ease of Tool Installation

Current state-of-the-art microelectronic component fabrication facilities require wide corridors to move the semitools into position within the processing area. The improved hub and spoke facility of the invention allows semitools to be rigged and lifted from the outside yard directly into position within the processing area. The installation is performed using a mobile crane and by simply removing a demountable section of the exterior wall, and positioning the semitool in the correct spot. Removing and changing a semitool is accomplished in the same fashion and is significantly simpler than removing a semitool from the current state-of-the-art fabs where cleanroom walls often have to be removed to accomplish the removal and change out of semitools.

Ease of Interfacing with SMIF and Other Minienvironment Systems

The hub and spoke layout is perfectly suited to house a standard Manufacturing Interface (SMIF) or other minienvironment system. These systems are becoming more popular as a method to simplify the overall cleanliness requirements for the processing areas of a microelectronic component fabrication facility. The ease in accommodating such minienvironments is due to the fact that the clean bay within a processing area along the spoke can be designed with an appropriate cleanliness specification to house the SMIF or other minienvironment system. The clean bay will always remain in a fixed spatial relationship within the spoke even after the fabrication facility is expanded by radiating the spoke further outward. This allows the clean bay to be designed to simply accommodate the SMIF or other minienvironment system. In the current state-of-the-art fabrication facilities. SMIF is expensive to retrofit after a clean bay and service chase layout is initially chosen.

Facility Housing and Roof Construction

Conventional fab facilities are about 600 feet long and about 150 to 180 feet wide. It is desirable that the roof for such a facility be supported by the outer walls as any post or pillars internal to the outer walls can restrict the placement of the equipment, further hindering fabrication process and maintenance of the facility. In order to avoid internal pillars and columns, the conventional roof and truss system, which is very expensive and heavy, is supported by the outer walls. In the present invention, as the processing area in a preferred embodiment are about 150 long and 60 feet wide, such a complicated and elaborated roof supporting trussing system is not required and thus there is substantial savings in fabrication of the plant.

Industrial Applicability

Accordingly, the present microelectronic component fabrication facility provides a cost effective, flexible, easily expandable processing plant.

Other features, aspects and objects of the invention can be obtained from a review of the figures and the claims.

It is to be understood that other embodiments of the invention can be developed and fall within the spirit and scope of the invention and claims.

I claim:

1. A microelectronics fabrication facility comprising:
   a central hub;
   a plurality of processing areas which radiate outwardly from said central hub;
   at least some of said processing areas having multiple microelectronic device processing tools;
   a hub building placed over the central hub and a processing area building placed over each of said plurality of processing areas, wherein said buildings are capable of human habitation; and
   wherein spaces located between adjacent processing areas are not enclosed by any building.

2. The facility of claim 1 wherein:
   at least some of said processing areas with said multiple microelectronic device processing tools can perform at least one of the processes of chemical vapor deposition, ion implantation, sputtering, etching, diffusion, and lithography.

3. The facility of claim 2 wherein:
   each processing area has said multiple microelectronic device processing tools which perform only one process.

4. The facility of claim 1 wherein:
   the processing areas radiate outwardly from the central hub in the configuration of a plurality of spokes.

5. The facility of claim 1 wherein:
   adjacent said processing areas are not parallel to each other.

6. The facility of claim 1 wherein:
   the capacity of the facility can be increased by adding on to one or more of said plurality of processing areas.

7. The facility of claim 1 wherein:
   each processing area has a proximal end and a distal end, with the proximal end placed adjacent to the central hub, and the capacity of said facility can be increased by adding on to the distal end of at least one processing area.

8. The facility of claim 1 wherein:

at least some said processing areas which use common services are arranged together.

9. The facility of claim 1 wherein said multiple microelectronic device processing tools extend from the central hub to a point located distally from the central hub, and the capacity of the facility can be increased by adding new processing tools at the point located distally from the central hub.

10. The facility of claim 1 including:

an automation stocker which is adapted to transport work pieces from the central hub along the processing area, back to the central hub and along another processing area.

11. A method of fabricating a microelectronic device comprising the steps of:

first processing a work piece with a first process in a first processing area, which processing area radiates outwardly from a central hub, wherein the processing area is covered by a first housing connected to a hub housing which covers the central hub, and wherein the first processing area has multiple microelectronic device processing tools;

first transporting the work piece along the first processing area to said central hub;

second transporting the work piece from the central hub and along a second processing area for processing the work piece in a second process, which second processing area radiates outwardly from the central hub, wherein the second processing area is covered by a second housing connected to said hub housing which said second housing is spaced from said first housing, wherein said buildings are capable of human habitation, and wherein said second processing area has multiple microelectronic device processing tools; and second processing the work piece in the second processing area.

12. The method of claim 11 including:

said step of first transporting said work piece to said central hub occurs along a path which is generally non-parallel to a path along which the step of second transporting said work piece from the central hub to said second process.

13. The method of claim 11 including:

said step of first transporting and said step of second transporting occur along first and second processing areas which are elongated and non-parallel to each other.

14. The method of claim 11 including:

in said first processing area the first process is selected from the group consisting of chemical vapor deposition, ion implantation, sputtering, etching, diffusion, and lithography; and in said second processing area the second process is different from the first process performed in the first processing area and is selected from the group consisting of chemical vapor deposition, ion implantation, sputtering, etching, diffusion, and lithography.

15. A method of constructing a microelectronics fabrication facility including the steps of:

constructing a central hub with a hub building enclosing said central hub; and constructing a plurality of processing areas radiating outwardly from the central hub, each of said processing area having another building enclosing each said processing area, which another building is connected to said hub building, wherein said buildings are capable of human habitation, and at least some of said processing area having multiple microelectronic device processing tools; and wherein spaces located between the processing areas are not enclosed by any building.

16. The method of claim 15 including the step of:

installing in at least some of said processing areas multiple microelectronic devices processing tools selected from the group consisting of chemical vapor deposition tools, ion implantation tools, sputtering tools, etching tools, diffusion tools, and lithography tools.

17. The method of claim 15 wherein each processing area has a proximal end located adjacent to the central hub and a distal end and the capacity of the microelectronics fabrication facility can be increased by the step of:

adding additional processing equipment outwardly of the distal end of at least one of the processing areas.

18. The method of claim 15 including:

constructing an automated stocker to transport a work piece from the central hub, along a processing area and back to the central hub, and then transporting the work piece to another processing area.

19. The method of claim 15 including:

providing emergency exits for personnel along the processing areas.

20. The method of claim 15 wherein said processing areas are elongated and have elongated walls extending outwardly from said central hub, the method including:

modifying the facility by installing additional processing equipment by moving the additional processing equipment through an opening in one of the elongated walls in one of the processing areas.

21. The facility of claim 1 including:

emergency exits for personnel located along walls of said processing area building.

22. The facility of claim 1 wherein:

said central hub is in the shape of one of a circle, and a polygon.

23. The method of claim 15 including the step of:

constructing a central hub in the shape of a circle, and a polygon.

\* \* \* \* \*

UNITED STATES PATENT AND TRADEMARK OFFICE
CERTIFICATE OF CORRECTION

PATENT NO. : 5,795,356
DATED : August 18, 1998
INVENTOR(S) : Lindsay Leveen

It is certified that error appears in the above-indentified patent and that said Letters Patent is hereby corrected as shown below:

Claim 11, column 7, line 36:
After "said" and before "are"
delete "buildings" and
substitute therefor
--housings--

Signed and Sealed this

Ninth Day of February, 1999

Attest:

Attesting Officer

*Acting Commissioner of Patents and Trademarks*

UNITED STATES PATENT AND TRADEMARK OFFICE
CERTIFICATE OF CORRECTION

PATENT NO. : 5,795,356
DATED : August 18, 1998
INVENTOR(S) : Lindsay Leveen

It is certified that error appears in the above-identified patent and that said Letters Patent is hereby corrected as shown below:

Title page, item [73], Assignee: should read --SLS Partners, Inc.--

Signed and Sealed this

Twenty-fourth Day of August, 1999

Attest:

Q. TODD DICKINSON

Attesting Officer

Acting Commissioner of Patents and Trademarks